(12) United States Patent  
Doyle

(10) Patent No.: US 7,113,014 B1
(45) Date of Patent: Sep. 26, 2006

(54) PULSE WIDTH MODULATOR

(75) Inventor: James Thomas Doyle, Nederland, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 72 days.

(21) Appl. No.: 10/402,091

(22) Filed: Mar. 28, 2003

(51) Int. Cl.
*H03K 3/017* (2006.01)

(52) U.S. Cl. ..................... 327/172; 327/178

(58) Field of Classification Search ............... 327/156, 327/155, 159, 160, 161, 172, 173, 174, 175, 327/178; 375/376, 375, 238; 331/DIG. 2, 331/17, 25, 57
See application file for complete search history.

(56) References Cited

U.S. PATENT DOCUMENTS

| | | | | |
|---|---|---|---|---|
| 4,788,674 | A * | 11/1988 | Maeda et al. | 369/47.51 |
| 5,602,882 | A * | 2/1997 | Co et al. | 375/372 |
| 6,262,611 | B1 * | 7/2001 | Takeuchi | 327/159 |
| 6,317,008 | B1 | 11/2001 | Gabara | 331/117 R |
| 6,351,165 | B1 * | 2/2002 | Gregorian et al. | 327/156 |
| 6,498,512 | B1 | 12/2002 | Simon et al. | 326/93 |
| 6,548,991 | B1 | 4/2003 | Maksimovic et al. | 323/224 |
| 6,819,190 | B1 * | 11/2004 | Pearce et al. | 331/57 |
| 2002/0178391 | A1 * | 11/2002 | Kushnick | 713/500 |

OTHER PUBLICATIONS

U.S. Appl. No. 10/053,858, filed Jan. 19, 2002, Maksimovic et al.
U.S. Appl. No. 10/106,428, filed Mar. 26, 2002, Doyle et al.
U.S. Appl. No. 10/351,061, filed Jan. 24, 2003, Chan et al.
U.S. Appl. No. 10/351,056, filed Jan. 24, 2003, Chan et al.
U.S. Appl. No. 10/053,226, filed Jan. 19, 2002, Maksimovic et al.
U.S. Appl. No. 10/053,227, filed Jan. 19, 2002, Kranzen et al.
U.S. Appl. No. 10/160,428, filed May 31, 2002, Bernmougal et al.
U.S. Appl. No. 10/166,822, filed Jun. 10, 2002, Maksimovic et al.
U.S. Appl. No. 10/236,482, filed Sep. 6, 2002, Maksimovic et al.
U.S. Appl. No. 10/272,027, filed Oct. 15, 2002, Doyle et al.
U.S. Appl. No. 10/324,997, filed Dec. 18, 2002, Chan et al.
U.S. Appl. No. 10/246,971, filed Sep. 19, 2002, Rives.
Benjamin James Patella, "Implementation of a High Frequency, Low-Power Digital Pulse Width Modulation Controller Chip", Thesis Submitted to Graduate School of University of Colorado in Department of Electrical and Computer Engineering, 2000, pp. 1-272.
Kaushik Roy, Leakage Tolerant Circuits, Sub-Threshold Logic [online]. No date, [Retrieved by inventor approximately Nov. 1, 2002]. Retrieved from the Internet: <URL:http://www.ece.purdue.edu/~visl/seven.pdf>, pp. 1-43.
John G. Maneatis, "Low-Jitter Process-Independent DLL and PLL Based on Self-Biased Techniques", 1996 ISCCC 8.1 Presentation Slides, 3 sheets, IEEE Journal of Solid-State Circuits, vol. 31, No. 11, Nov. 1996, pp. 1723-1732.

(Continued)

*Primary Examiner*—Linh My Nguyen
(74) *Attorney, Agent, or Firm*—Mark C. Pickering

(57) ABSTRACT

A low-power, synchronous pulse width modulator utilizes a first clock signal at a first frequency to generate a pulse-width modulated signal at the first frequency without requiring a second over sampling clock signal that has a substantially higher frequency by selecting taps from a phase shifting structure to synthesize the waveform.

28 Claims, 7 Drawing Sheets

OTHER PUBLICATIONS

Jim Doyle and Bill Broach, Small Gains in Power Efficiency Now, Bigger Gains Tomorrow [online]. Jul. 9, 2002, [Retrieved on Feb. 1, 2003]. Retrieved from the Internet:<URL:http://www.commsdesign.com/design_corner/OEG20020709S0022>. pp. 1-5.

Robert W. Wrickson and Dragan Maksiomovic, Fundamentals of Power Electronics, Second Edition, Kluwer Academic Publishers, 2001, pp. 333.

Krisztian Flautner, Steven Reinhardt and Trevor Mudge, Automatic Performance Setting for Dynamic Voltage Scaling, Wireless Networks, vol. 8, Issue 5, Sep. 2002, pp. 507-520, and Citation, pp. 1-3, [online]. [Retrieved on Feb. 2, 2003]. Retrieved from the Internet: <URL:http://portal.acm.org/citation.cfm?id=582455.582463&coll=portal&d1=ACM&idx=J804&p....>.

Krisztian Flautner, Steven Reinhardt and Trevor Mudge, Automatic Performance for Dynamic Voltage Scaling [online]. May 30, 2001, [Retrieved on Feb. 2, 2003]. Retrieved from the Internet: <URL:http://eecs.umich.edu/~tnm/papers/mobicom01/pdf>.pp. 1-12.

Texas Instruments, "Synchronous-Buck PWM Controller With NMOS LDO Controller", TPS5110, SLVS025A-Apr. 2002, Revised Jun. 2002.

Intel XScale Core, Developer's Manual, Dec. 2000, [online], [Retrieved on Feb. 2, 2003]. Retrieved from the Internet:<URL:http://developer.intel.com/design/intelxscale/27347301/pdf>. pp. 1-1 through B-1.

* cited by examiner

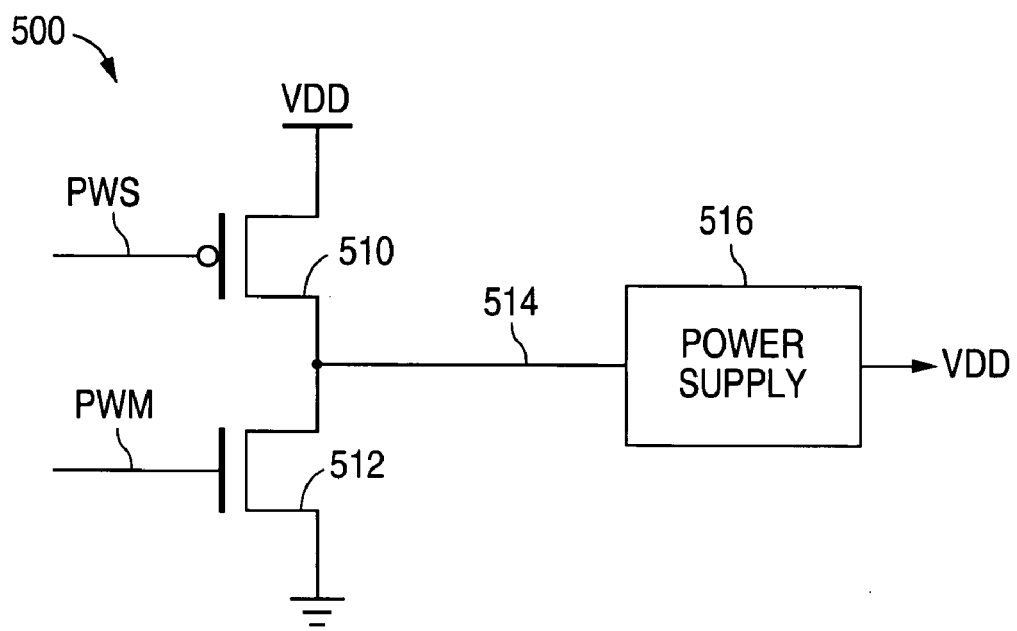
FIG. 5A
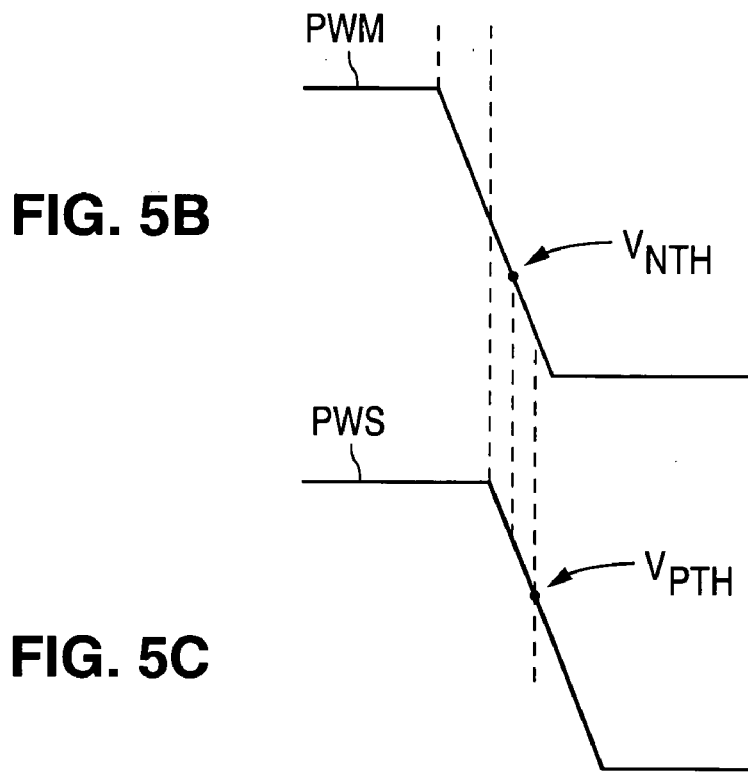
FIG. 5B
FIG. 5C

PULSE WIDTH MODULATOR

BRIEF DESCRIPTION OF THE DRAWINGS

FIGS. 5A–5C are diagrams illustrating an example of minimizing the shoot through current in accordance with the present invention.

DETAILED DESCRIPTION OF THE INVENTION

Figure 1:
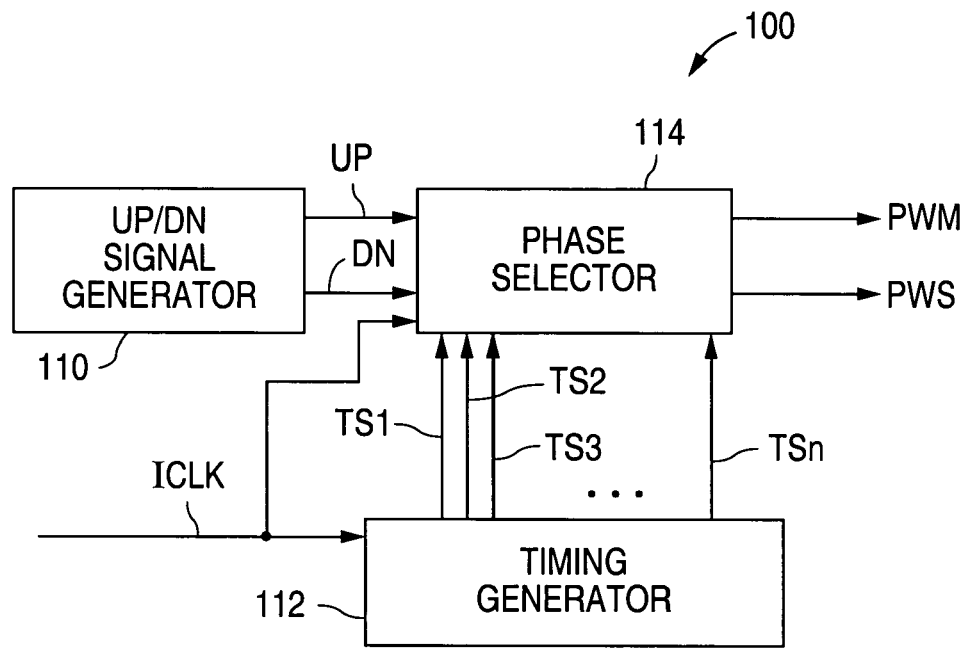
FIG. 1 is a block diagram illustrating an example of a pulse-width modulator 100 in accordance with the present invention.

FIG. 1 shows a block diagram that illustrates an example of a pulse-width modulator 100 in accordance with the present invention. As described in greater detail below, modulator 100 utilizes a first clock signal at a first frequency to generate a pulse-width modulated signal at the first frequency without requiring a second over sampling clock signal that has a substantially higher frequency. The pulse width modulator of the present invention requires only a single clock signal at a single clock frequency to generate a pulse-width modulated signal at that frequency.

As shown in FIG. 1, modulator 100 includes an up/down signal generator 110 that outputs an up signal UP and a down signal DN. The up and down signals UP and DN represent, for example, timing information that indicates whether a supply voltage is high enough to support the timing requirements of a circuit at a clock frequency.

Figure 2:
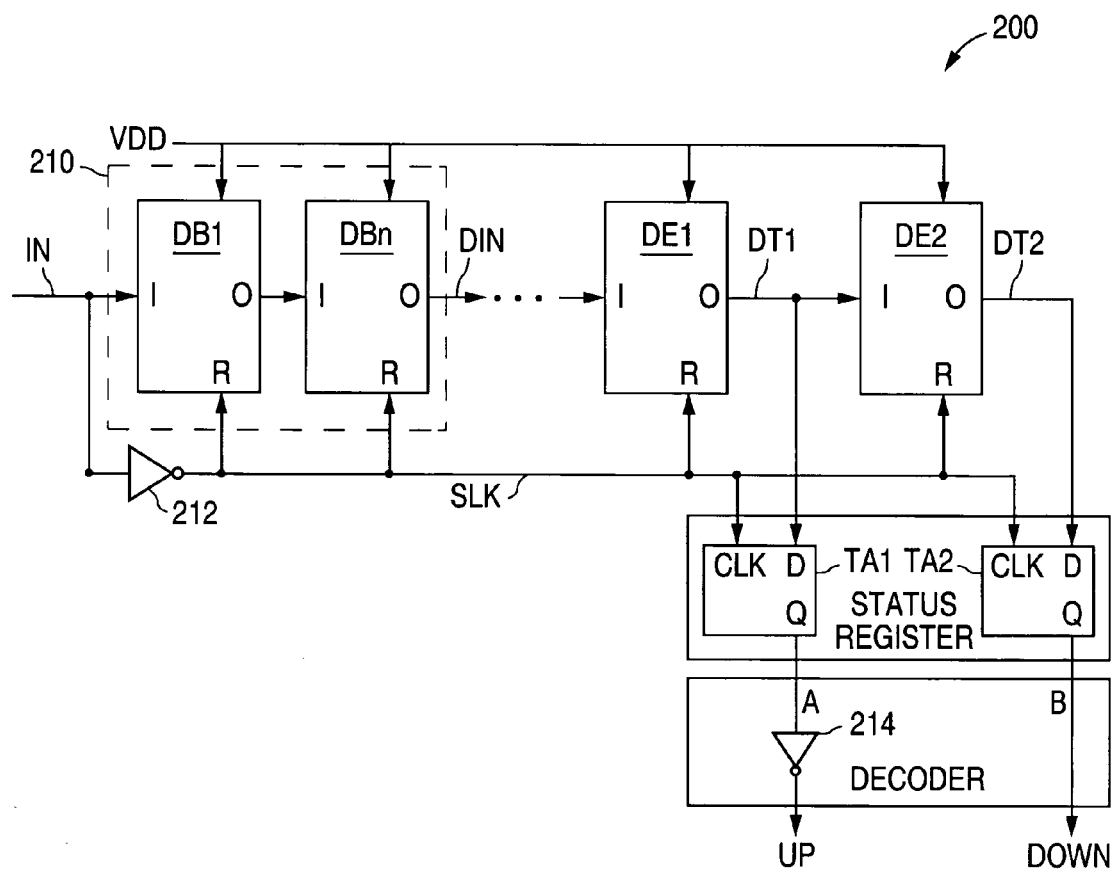
FIG. 2 is a schematic diagram illustrating an example of an up/down signal generator 200 in accordance with the present invention.

FIG. 2 shows a schematic diagram that illustrates an example of an up/down signal generator 200 in accordance with the present invention. As shown in FIG. 2A, generator 200 is a time slack detector that includes a critical path delay 210 that receives an input signal IN, such as a clock signal, and outputs a delayed input signal DIN.

Critical path delay 210 models the worst case propagation delay from a first point in a circuit to a second point in the circuit. Delay 210 can be implemented with, for example, a replica of the gates that make up the worse case propagation delay, or a number of serially-connected delay blocks DB1–DBn. Each delay block DB, in turn, can include a number of serially-connected delay cells.

Figure 3:
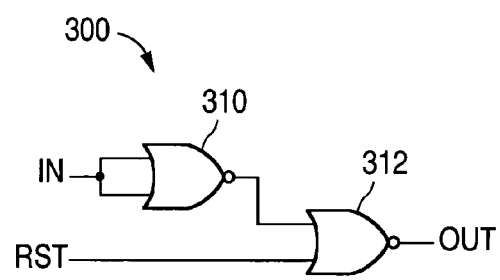
FIG. 3 is a schematic diagram illustrating an example of a delay cell 300 in accordance with the present invention.

FIG. 3 shows a schematic diagram that illustrates an example of a delay cell 300 in accordance with the present invention. As shown in FIG. 3, delay cell 300 includes a first NOR gate 310 and a second NOR gate 312. NOR gate 310 includes a pair of inputs connected together to receive the input signal IN, and an output. NOR gate 312 includes a signal input connected to the output of NOR gate 310, a reset input, and an output.

As further shown in FIG. 2, generator 200 also includes a pair of delay elements DE1 and DE2 that have a corresponding pair of outputs DT1 and DT2, respectively. The first delay element DE1 is connected to receive the delayed input signal DIN, while the second delay element DE2 is connected to the first delay element DE1. Each delay element DE has a number of delay cells, such as cell 300.

Generator 200 additionally includes a pair of taps (latches) TA1 and TA2 that are connected to the outputs of the first and second delay elements DE1 and DE2, respectively. (By connecting tap TA1 to the output of delay element DE1 rather than the output of critical path delay circuit 210, a timing margin is added.)

Taps TA1 and TA2 latch and output the logic states of the delay elements DE1 and DE2 in response to the rising edge of a sample signal SLK. The sample signal SLK can be generated with, for example, an inverter 212 that inverts the input signal IN when one-half of the period of the input signal IN is substantially equal to the maximum propagation delay through critical path 210. Delay blocks DB1–DBn and delay elements DE1 and DE2 are also reset when the outputs of elements DE1 and DE2 are latched by taps TA1 and TA2. As a result, delay blocks DB1–DBn and delay elements DE1 and DE2 are reset each time the input signal IN is low.

In operation, when the supply voltage VDD is set to consume minimum power for the frequency of the clock signal CLK, the rising edge of the signal IN input to critical delay path circuit 210 propagates through first delay element DE1, but not through second delay element DE2, before the rising edge of the sample signal SLK latches the logic states.

As a result, tap TA1 latches a logic high from delay element DE1, while tap TA2 latches a logic low from delay element DE2. The 10 logic states latched by taps TA1 and TA2 can be directly output as the up and down signals UP and DN, respectively, or the logic high from tap TA1 can be inverted with an inverter, such as inverter 214, to output the up and down signals UP and DN as a logic 00.

When the frequency of the clock signal CLK decreases, the frequency of the input signal IN also decreases. As a result, the rising edge of the input signal IN passes through both the first and second delay elements DE1 and DE2 before the rising edge of the sample signal SLK latches the values. The rising edge passes through both the first and second delay elements DE1 and DE2 because the period of the input signal IN is now longer.

As a result, tap TA1 latches a logic high from delay element DE1, and tap TA2 latches a logic high from delay element DE2. The 11 logic states latched by taps TA1 and TA2 can be directly output as the up and signals UP and DN, respectively, or if the logic high from tap TA1 is inverted, as a logic 01.

Thus, at a lower frequency, more propagation delay is required before taps TA1 and TA2 can again latch the logic 10 states. When the up signal UP is a logic low and the down signal DN is a logic high, a power supply decreases the supply voltage VDD until taps TA1 and TA2 again latch a logic high and a logic low.

When the frequency of the clock signal CLK changes from a low to a high frequency, the frequency of the input signal IN also increases. As a result, the rising edge of the input signal IN fails to make it to first delay element DE1 before the rising edge of the sample signal SLK latches the logic states. The rising edge does not make it to first delay element DE1 because the period of the input signal IN is shorter.

As a result, tap TA1 latches a logic low from first delay element DE1, and tap TA2 latches a logic low from the second delay element DE2. The 00 logic states latched by taps TA1 and TA2 can be directly output as the up and down signals UP and DN, respectively, or if the logic high from tap TA1 is inverted, as a logic 10.

At higher frequencies, less propagation delay is required before taps TA1 and TA2 can again latch the logic 10 states. When the up signal UP is a logic high and the down signal DN is a logic low, the power supply increases the supply voltage VDD. The propagation delay corresponds with the supply voltage VDD such that when the delay is sufficiently decreased so that taps TA1 and TA2 can again latch a logic high and a logic low, the supply voltage VDD is again set to consume minimum power at the clock frequency.

Thus, detector 200 provides a circuit and a method of adjusting the supply voltage VDD to use the minimum supply voltage with a given clock frequency, thereby reducing power consumption. Detector 200 removes slack and responds to changes in the frequency of the clock signal. Detector 200 can be implemented as described in U.S. patent application Ser. No. 10/053,226 filed on Jan. 19, 2002 by Dragan Maksimovic et al. which is hereby incorporated by reference.

Figure 4:
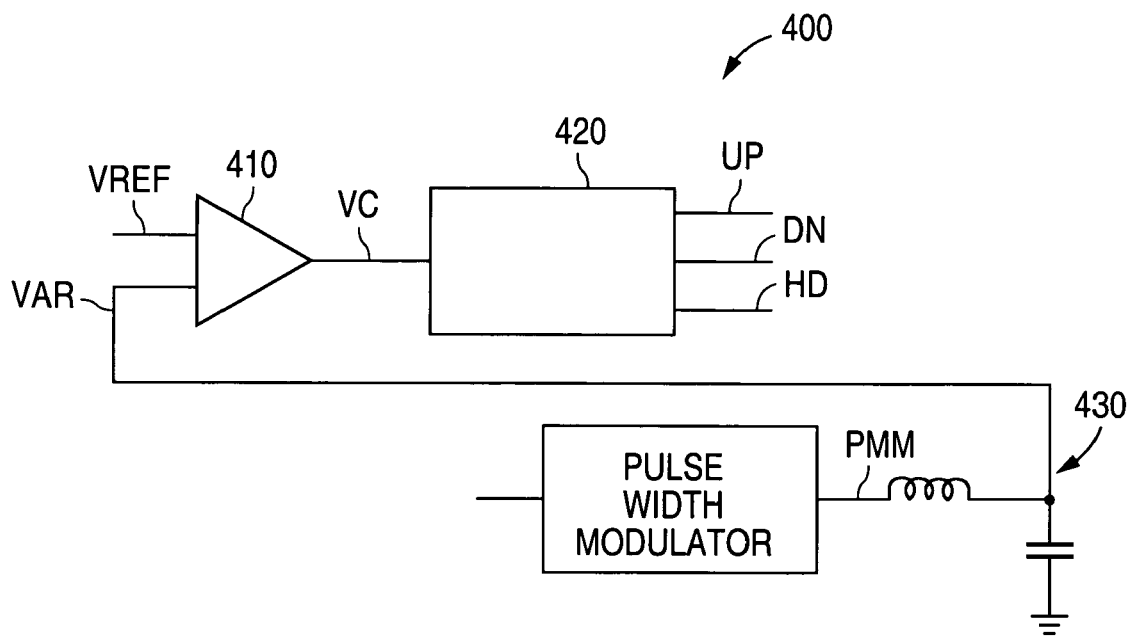
FIG. 4 is a schematic diagram illustrating another example of an up/down signal generator 400 in accordance with the present invention.

FIG. 4 shows a schematic diagram that illustrates another example of an up/down signal generator 400 in accordance with the present invention. As shown in FIG. 4, generator 400 includes a comparator 410 that has a first input connected to a reference voltage source VREF, and a second input connected to a varying voltage source VAR.

In addition, comparator 410 has an output that outputs a comparison voltage VC with a first value when the voltages of the reference voltage source VREF and the varying voltage source VAR are substantially equal. Further, the comparison voltage VC has a second value when the reference voltage source VREF is greater than the varying voltage source VAR, and a third value when the reference voltage source VREF is less than the varying voltage source VAR.

As further shown in FIG. 4, generator 400 includes a charge pump controller 420 that outputs a hold signal HD when the sources VREF and VAR are substantially equal, an up signal UP when the reference voltage source VREF is greater than the varying voltage source VAR, and a down signal DN when the reference voltage source VREF is less than the varying voltage source VAR. The varying voltage source VAR, in turn, is generated by inputting a pulse-width modulated signal PMM into an LC circuit 430 where the voltage VAR varies due to changes in the pulse width of the signal PMM input into LC circuit 430.

Returning to FIG. 1, in addition to up/down signal generator 110, modulator 100 also includes a timing generator 112 that receives an input clock signal ICLK, and outputs a series of timing signals TS1–TSn that represent a series of phase increments of the input clock signal ICLK. For example, if the input clock signal ICLK has a period of 2 uS (a 500 MHz clock), and 128 timing signals TS1–TS128 are present, then the 2 uS period is divided into 128 equal phase increments or periods of approximately 15.63 nS.

In this example, timing generator 112 outputs rising edges in response to the rising edge of the input clock signal ICLK such that the first timing signal TS1 goes high approximately 15.63 nS after the rising edge of the input clock signal ICLK goes high. After this, each succeeding timing signal TS goes high approximately 15.63 nS after the directly preceding timing signal TS goes high. Thus, the series of timing signals TS1–TSn output by timing generator 112 provide a rising edge every 15.63 nS.

As further shown in FIG. 1, modulator 100 includes a phase selector 114 that generates a pulse-width modulated signal PWM in response to the up signal UP, the down signal DN, and the input clock signal ICLK. (When generator 110 and selector 114 are in separate packages, the pin count can be reduced by utilizing a tri-state input in lieu of the up and down signals UP and DN.) In addition, the pulse-width modulated signal PWM is also responsive to the timing signals TS1–TSn output by timing generator 112.

Selector 114 generates the pulse-width modulated signal PWM by utilizing an edge (e.g., the rising edge) of the input clock signal ICLK to form an edge (e.g., the rising edge) of the pulse-width modulated signal PWM that is synchronized to the edge of the clock signal ICLK, and one of the series of timing signals TS1–TSn to generate the next edge (e.g., the falling edge) of the pulse-width modulated signal PWM. The timing signal TS used to generate the falling edge, in turn, is defined by the logic states of the up and down signals UP and DN. (Other clock signals can alternately be used to generate the rising edge of the pulse-width modulated signal PWM.)

When the logic states of the up and down signals UP and DN are, for example, a 00, then the current timing signal TS is used or, after power up or reset, the middle timing signal TS64 is used. When the logic states of the up and down signals UP and DN are, for example, a 10, then the next greater timing signal TS is used (e.g., from TS64 to TS65). On the other hand, when the logic states of the up and down signals UP and DN are, for example, a 01, then the next smaller timing signal TS is used (e.g., from TS64 to TS63).

Thus, in the above example, the pulse-width modulated signal PWM has a 2 uS period with a pulse width that can change each period by 15.63 nS. Since the pulse widths change in response to the up and down signals UP and DN, the pulse-width modulated signal PWM is modulated by, in the above example, changes in the power supply voltage that are necessary to insure that the input signal IN can pass through the first delay element DE1, but not through the second delay element DE2, when the leading edge of the sample signal SLK occurs.

One of the advantages of the present invention is that the present invention allows a pulse-width modulated signal to be generated from a single (existing) clock signal (only a single clock signal at a single clock frequency is required to generate the pulse-width modulated signal at that frequency in the present invention), and modulated by the up and down signals UP and DN of, for example, a slack time detector, to pass voltage information to, for example, a power supply.

This provides a significant power savings over all digital approaches that utilize counters and dividers to generate a pulse-width modulated signal as these approaches require an over sampling clock signal with a frequency that can be 32× or more greater than the frequency of the pulse-width modulated signal. Another advantage of the present invention is that the present invention is synchronous. This is important in many applications. Thus, the present invention provides a pulse width modulator that is low power and digitally robust.

In addition, phase selector 114 can generate more than two pulse-width modulated signals for use in other applications. For example, a second pulse-width modulated signal PWS can be generated. One advantage of generating two pulse-width modulated signals is that the p-channel and n-channel driver transistors can be individually controlled to substantially reduce or eliminate a shoot through current that flows when both the n-channel and p-channel driver transistors are on at the same time.

FIGS. 5A–5C shows diagrams that illustrate an example of minimizing the shoot through current in accordance with the present invention. FIG. 5A shows a schematic diagram of a communications system 500 in accordance with the present invention. As shown in FIG. 5A, communications system 500 includes a p-channel driver transistor 510 with a gate connected to receive the pulse-width modulated signal PWS, a source connected to a power supply VDD, and a drain. Further, system 500 includes an n-channel driver transistor 512 with a gate connected to receive the pulse-width modulated signal PWM, a source connected to ground, and a drain connected to the drain of transistor 510.

System 500 also includes a communications channel 514 that is connected to the drains of driver transistors 510 and 512, and a power supply 516 that is connected to communications channel 514. Power supply 516 outputs the supply voltage VDD, and varies the magnitude of the supply voltage VDD in response to the pulse width signal output by drivers 510 and 512.

FIGS. 5B and 5C show timing diagrams that illustrate the falling edges of the pulse-width modulated signal PWM and the pulse-width modulated signal PWS, respectively, in accordance with the present invention. In the example shown in FIGS. 5B–5C, the pulse-width modulated signal PWS falls after the pulse-width modulated signal PWM has fallen so that the n-channel driver transistor 512 is turned off (the gate-to-source voltage is less than the threshold voltage $V_{NTH}$) before the p-channel driver transistor 510 is turned on (the gate-to-source voltage is less than the threshold voltage $V_{PTH}$).

By turning n-channel driver transistor 512 off before the p-channel driver transistor 510 is turned on, the shoot through current path is removed. As a result, the shoot through current is substantially reduced or eliminated. (The pulse-width modulated signals PWM and PWS can also be non-overlapping such that the pulse-width modulated signal PWM has completely reached ground before the pulse-width modulated signal PWS begins to fall.)

Figure 6:
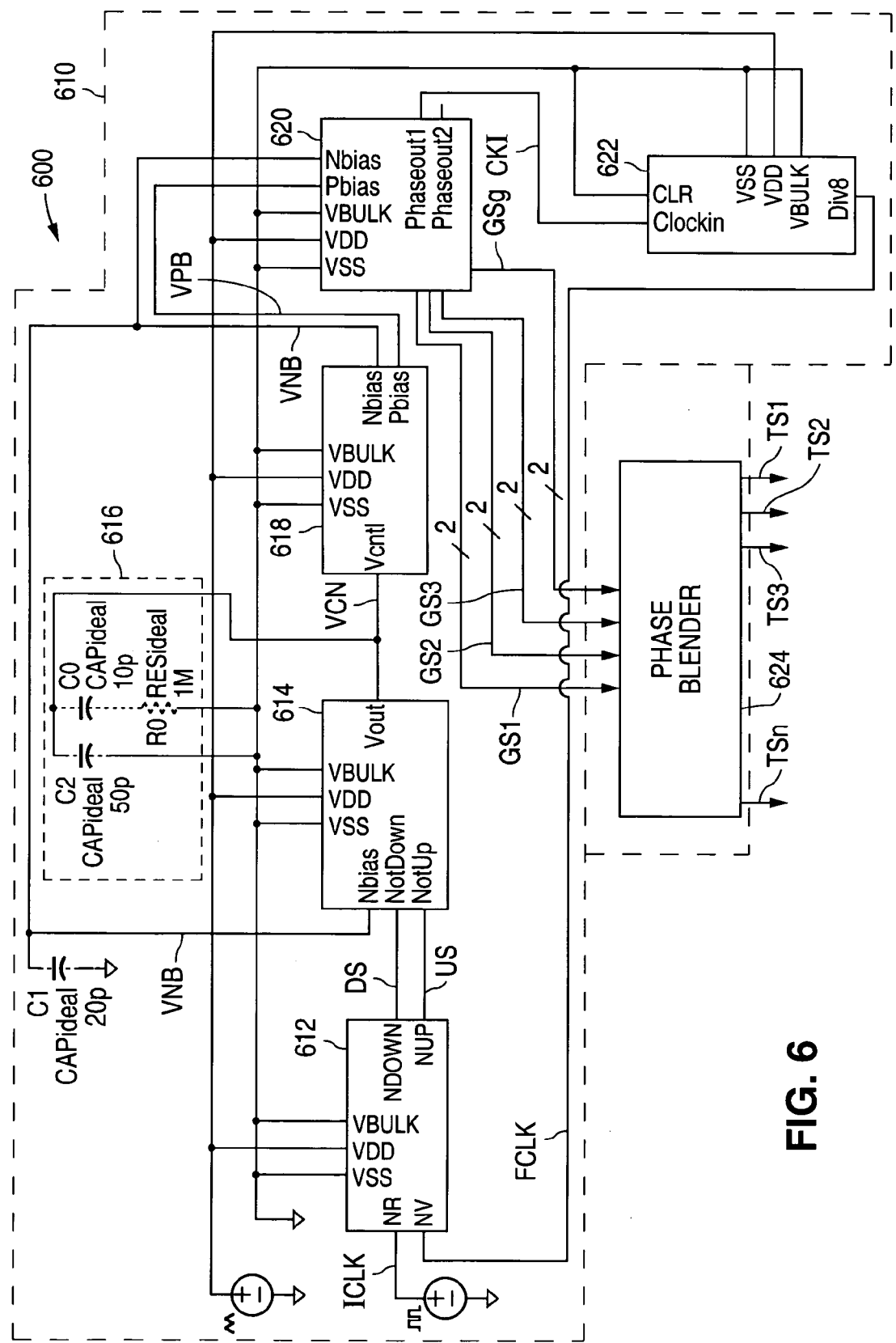
FIG. 6 is a block diagram illustrating an example of a timing generator 600 in accordance with the present invention.

FIG. 6 shows a block diagram that illustrates an example of a timing generator 600 in accordance with the present invention. As shown in FIG. 6, timing generator 600 includes a self-biased, phase-lock-loop (PLL) 610. PLL 610, in turn, includes an edge-detecting, phase comparator (a phase frequency detector) 612 that compares the input clock signal ICLK to a feedback clock signal FCLK, and outputs an up signal US and a down signal DS which indicate via their logic states whether the two signals ICLK and FCLK are locked, or whether one signal leads the other signal.

PLL 610 also includes a charge pump 614, a loop filter 616, and bias generator 618. Charge pump 614 generates a control voltage VCN at an output Vout in response to the logic states of the up and down signals US and DS. The control voltage VCN goes up in response to the up signal US, down in response to the down signal DN, and remains the same in response to both signals US and DS.

Loop filter 616, which includes a first capacitor C0 and a resistor R0 connected in series between the output Vout of charge pump 614 and ground, and a second capacitor C2 connected between the output Vout of charge pump 614 and ground, provides stability and smoothes the control voltage VCN. In addition, bias generator 618 generates an n-bias voltage VNB and a p-bias voltage VPB in response to the control voltage VCN.

PLL 610 further includes a voltage controlled oscillator (VCO) 620 that outputs a clock signal CKI in response to the p-bias and n-bias voltages VPB and VNB, and a divider 622 that divides down the clock signal CKI to form the feedback clock signal FCLK. VCO 620 includes a number of stages that output a corresponding number of timing strobes GS1–GSg. (The timing strobes GS1–GSg are differentially implemented in the example.) For example, a four stage VCO outputs timing strobes GS1–GS4.

In operation, the p-bias and n-bias voltages VPB and VNB are adjusted until the phase of the feedback clock signal FCLK is locked to the phase of the input clock signal ICLK. When locked, each of the timing strobes GS1–GSg are equally spaced apart such that, in the case of a four stage VCO, the timing strobes GS1–GS4 are delayed in phase by 90°, 180°, 270°, and 360°, respectively, from an edge (e.g., rising) of the input clock signal ICLK. For a 500 KHz clock signal with a 2 uS period, the timing strobes GS1–GS4 are delayed in time by 0.5 uS, 1.0 uS, 1.5 uS, and 2.0 uS, respectively, from an edge of the input clock signal ICLK.

One of the advantages of PLL 610 is that PLL 610 is a self-biased PLL that eliminates process dependencies over a wide range of operating conditions. PLL 610 has been shown to work down to 1.3V while still providing the necessary phase delays. At 6 MHz, the current was measured to be less than 30 uA (e.g., 20 uA). In addition, using a self-biased PLL provides considerable flexibility and permits use of a wide range of input frequencies. For example, PLL 610 can be used with frequencies that vary from 500 KHz to 700 KHz. Further, the use of an internal oscillator (VCO 620) reduces the pin count.

Figure 9:
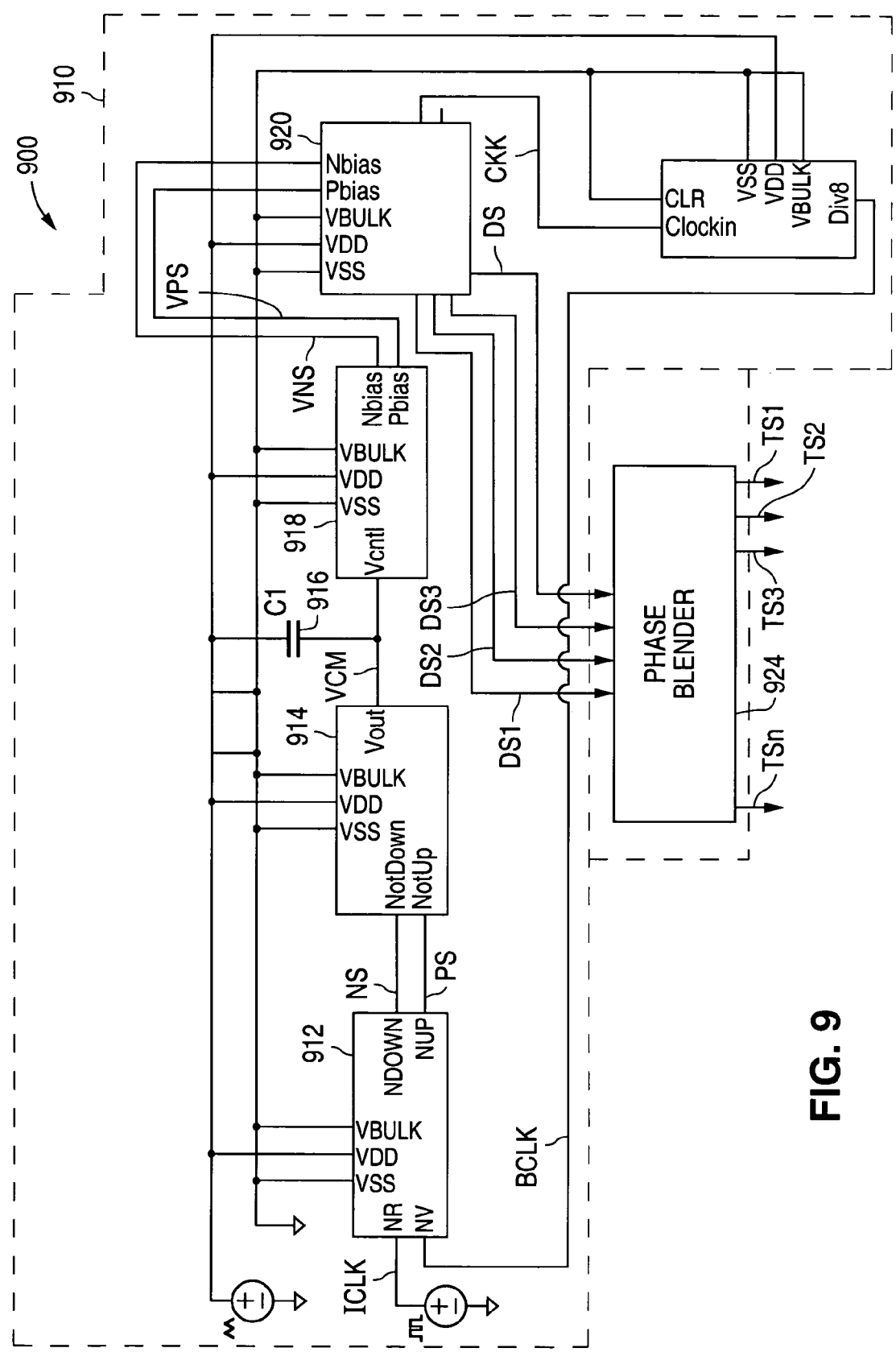
FIG. 9 is a block diagram illustrating an example of a timing generator 900 in accordance with the present invention.

PLL 610 is similar to the self-biased PLL shown in FIG. 9 of Mantis, John G., "Low-Jitter Process-Independent DLL and PLL Based on Self-Biased Techniques," IEEE Journal of Solid-State Circuits, Vol. 31, No. 11 Nov. 1996, which is hereby incorporated by reference. PLL 610 differs from the FIG. 9 Maneatis circuit in that PLL 610 feeds the n-bias voltage VNB back to power supply 614, and connects the line to ground via a capacitor C1.

Capacitor C1 removes oscillation from the n-bias voltage VNB feedback loop that can occur when PLL 610 is operated under low-power conditions. With low-power conditions, the phase delays are greater and the gain increases which, in turn, causes oscillation when the gain is greater than one and the phase shift is 360°.

In addition to PLL 610, as further shown in FIG. 6, timing generator 600 includes a phase blender (phase interpolator) 624 that generates a series of timing signals TS1–TSn from the timing strobes GS1–GSg that are output from VCO 620. Phase blender 624 interpolates between the steps of adjacent VCO stages, and then interpolates again as necessary to obtain the desired resolution. For example, phase blender 624 can generate 128 equally-spaced timing signals TS1–TS128 from four equally-spaced timing strobes GS1–GS4.

The phases of the timing signals TS1–TSn can be tuned and since the timing signals TS1–TSn are locked to a precise reference frequency, the delays are also precise over process, voltage, and temperature (PVT). This results in a robust and consistent design over manufacturing tolerances. In addition, although high-speed VCOs use a relatively small number of stages (e.g., four), a VCO with a larger number of stages can alternately be used with a smaller phase blender, or to eliminate the need for phase blender 624.

Figure 7:
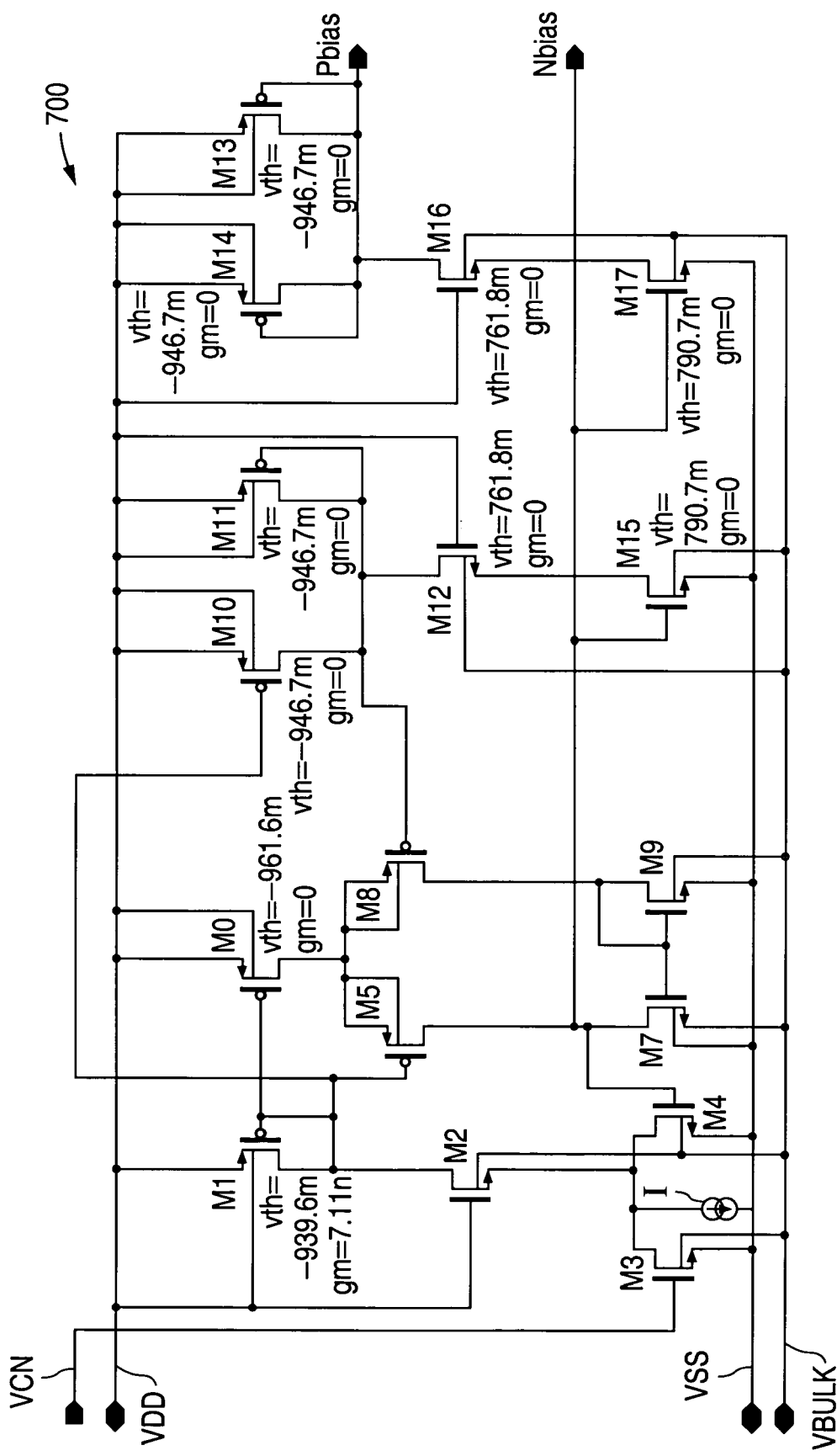
FIG. 7 is a schematic diagram illustrating an example of a bias generator 700 in accordance with the present invention.

FIG. 7 shows a schematic diagram that illustrates an example of a bias generator 700 in accordance with the present invention. Bias generator 700 is similar to the bias generator shown in FIG. 2 of the Maneatis paper. One difference between generator 700 and the Maneatis FIG. 2 circuit is that the control voltage VCN input to generator 700 from power supply 614 and loop filter 616 (see FIG. 6) is connected to the gate of MOS transistor M3. (The FIG. 2 Maneatis circuit shows the control voltage VCTRL connected to the transistors that are equivalent to transistors M5 and M10 in generator 700, while the gate of the equivalent of transistor M3 is connected to a bias initiation block.)

Another difference is that generator 700 includes a trickle current source I that is connected between ground and the drains of transistors M3 and M4. Trickle current source I can be implemented with, for example, a high value resistor or a small current mirror. In operation, trickle current source I sinks a small current that pulls down the voltage on the source of MOS transistor M2. When the voltage on the source of transistor M2 falls such that the gate-to-source voltage is equal to or greater than the threshold voltage, transistor M2 turns on which, in turn, turns on transistor M1, thereby starting the self-biased circuit.

Figure 8:
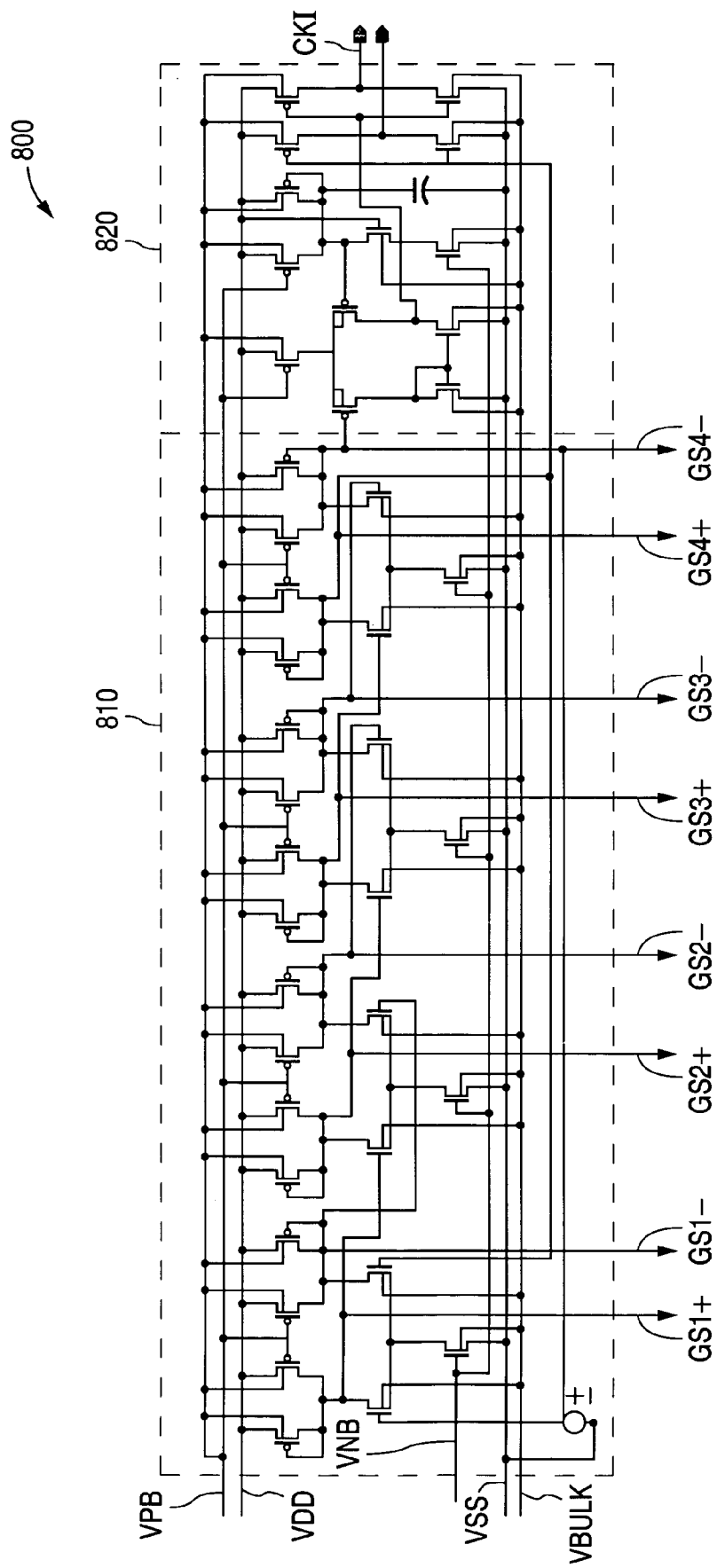
FIG. 8 is a schematic diagram illustrating an example of a voltage controlled oscillator 800 in accordance with the present invention.

FIG. 8 shows a schematic diagram that illustrates an example of a voltage controlled oscillator (VCO) 800 in accordance with the present invention. As shown in FIG. 8, VCO 800 includes a four-stage oscillator 810 that differentially outputs the timing strobes GS1 (GS1+/GS1−), GS2 (GS2+/GS2−), GS3 (GS3+/GS3−), and GS4 (GS4+/GS4−), and a level-shifter 820. Level shifter 820 provides voltages that are sufficient to maintain rail-to-rail operation and drive digital divider 622.

FIG. 9 shows a block diagram that illustrates an example of a timing generator 900 in accordance with the present invention. As shown in FIG. 9, timing generator 900 includes a delay-lock-loop (DLL) 910. DLL 910, in turn, includes a phase comparator 912 that compares the input clock signal ICLK to a feedback clock signal BCLK, and outputs an up signal PS and a down signal NS which indicate via their logic states whether the two signals ICLK and BCLK are locked, or whether one signal leads the other signal.

DLL 910 also includes a charge pump 914, a loop filter 916, and bias generator 918. Charge pump 914 generates a control voltage VCM at an output Vout in response to the logic states of the up and down signals PS and NS. The control voltage VCM goes up in response to the up signal PS, down in response to the down signal NS, and remains the same in response to both signals PS and NS.

Loop filter 916, which includes a first capacitor C1 connected between the output Vout of charge pump 914 and the power supply VDD, smoothes the control voltage VCM. In addition, bias generator 918 generates an n-bias voltage VNS and a p-bias voltage VPS in response to the control voltage VCM.

DLL 910 further includes a voltage controlled delay line (VCDL) 920 that outputs a clock signal CKK in response to the p-bias and n-bias voltages VPS and VNS, and a divider 922 that divides down the clock signal CKK to form the feedback clock signal BCLK. VCDL 920 includes a number of serially-connected delay stages that output a corresponding number of timing strobes DS1–DSr. For example, a ten delay stage VCDL outputs timing strobes DS1–DS10.

In operation, the p-bias and n-bias voltages VPS and VNS are adjusted until the phase of the feedback clock signal BCLK is locked to the phase of the input clock signal ICLK. DLL 910 adjusts the phase by increasing or reducing the number of delay stages that the signal passes through before being output as the clock signal CKK.

When locked, the number of delay stages in the signal path divides the period of the clock signal into a number of equally-spaced intervals. Thus, each of the timing strobes DS1–DSr are equally spaced apart such that, in the case of a VCDL that is locked with ten stages, the timing strobes DS1–DS10 are delayed in phase by 36°, 72°, . . . , to 360°, respectively, from an edge (e.g., rising) of the input clock signal ICLK.

For a 500 KHz clock signal with a 2 uS period, the timing strobes DS1–DS10 are delayed in time by 0.2 uS, 0.4 uS, . . . , to 2.0 uS, respectively, from an edge of the input clock signal ICLK. DLL 910 is similar to the self-biased DLL shown in FIG. 3 of Mantis. Although DLL 910 provides an all digital approach (PLL 610 requires analog components), PLL 610 is smaller and requires less power than DLL 910.

In addition to DLL 910, as further shown in FIG. 9, timing generator 900 includes a phase blender 924 that generates a series of timing signals TS1–TSn from the timing strobes DS1–DSr that are output from VCDL 920. For example, phase blender 924 can generate 128 equally spaced timing signals TS1–TS128 from ten equally spaced timing strobes DS1–DS10.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A pulse width modulator comprising:
   a timing generator connected to receive a clock signal, and generate a series of timing signals in response to the clock signal, the timing signals representing a series of phase increments of the clock signal, the clock signal having a plurality of clock pulses, each clock pulse having a first clock edge and a second clock edge; and
   a phase selector connected to receive the clock signal and the timing signals, and generate a pulse-width modulated (PWM) signal that has a plurality of PWM pulses, each PWM pulse having a first PWM edge and a second PWM edge, the phase selector generating the first PWM edge of each PWM pulse in response to the first edge of a clock pulse, and the second PWM edge of each PWM pulse in response to a timing signal of the series of timing signals.

2. The pulse width modulator of claim 1 wherein each first PWM edge is a rising edge and each second PWM edge is a falling edge.

3. The pulse width modulator of claim 1 wherein a first timing signal changes logic states from a first state to a second state a predefined time after an edge of a clock pulse changes logic states, and each succeeding timing signal changes from a first to a second state the predefined time after a directly preceding timing signal changes from the first to the second logic state.

4. A method of forming a pulse-width modulated signal, the method comprising:
   receiving a clock signal and outputting a series of timing signals in response to the clock signal, the timing signals representing a series of phase increments of the clock signal, the clock signal having a plurality of clock pulses, each clock pulse having a first clock edge and a second clock edge; and
   generating a pulse-width modulated (PWM) signal in response to a number of signals, the number of signals including the clock signal and the timing signals, the pulse-width modulated signal having a plurality of PWM pulses, each PWM pulse having a first PWM edge and a second PWM edge, and being generated by forming the first PWM edge of each PWM pulse in response to the first edge of a clock pulse of the clock signal, and forming the second PWM edge of each PWM pulse in response to a timing signal of the series of timing signals.

5. The method of claim 4 wherein each first PWM edge is a rising edge and each second PWM edge is a falling edge.

6. The method of claim 4 wherein a first timing signal changes logic states from a first state to a second state a predefined time after an edge of a clock pulse changes logic states, and each succeeding timing signal changes from a first to a second state the predefined time after a directly preceding timing signal changes from the first to the second logic state.

7. The method of claim 4 and further comprising generating a selection signal in response to an input signal, and selecting the timing signal of the series of timing signals in response to the selection signal.

8. The method of claim 7 wherein the selection signal includes an up signal and a down signal, the input signal passes through a delay line, and the up and down signals are generated in response to logic states of a number of elements of the delay line that indicate how far down the delay line the input signal passed during a sample period.

9. The pulse width modulator of claim 1 wherein the clock signal has a frequency, and the pulse-width modulated signal has a frequency substantially equal to the frequency of the clock signal.

10. The pulse width modulator of claim 9 wherein the phase selector receives no other clock signal with a frequency that is greater than the frequency of the clock signal.

11. The pulse width modulator of claim 9 and further comprising a selection signal generator that outputs a selection signal in response to an input signal, and wherein the phase selector receives the selection signal, and selects a timing signal of the series of timing signals in response to the selection signal.

12. The pulse width modulator of claim 11 wherein the selection signal generator includes:
a delay line having a sequence of elements that are connected to a supply voltage, the input signal passing through the delay line; and
a number of latches that capture a logic state from each of a number of the elements to indicate how far the input signal traveled down the delay line during a sample period, the selection signal including an up signal and a down signal, the up and down signals being generated from the logic state of the number of the elements to increase or decrease the supply voltage so that the input signal travels a predetermined distance down the delay line during the sample period.

13. The pulse width modulator of claim 12 wherein predetermined distance is equal to or greater than a critical path delay.

14. The pulse width modulator of claim 12 wherein the input signal has an input period, and the sample period is one-half the input period.

15. The pulse width modulator of claim 11 wherein the selection signal includes an up signal and a down signal, and the selection signal generator includes:
a comparator that receives a reference voltage and a varying voltage, and outputs a comparison voltage that indicates whether the varying voltage is greater than, equal to, or less than the reference voltage;
a controller connected to the comparator that generates the up signal and the down signal in response to the comparison voltage;
a PWM circuit that outputs a modulated signal; and
an LC circuit that receives the modulated signal and forms the varying voltage.

16. A method of forming a pulse-width modulated signal, the method comprising:
receiving a clock signal that has a plurality of clock pulses, and outputting a series of timing signals in response to the clock signal, the series of timing signals representing a series of incrementally delayed clock signals; and
generating a pulse-width modulated (PWM) signal that has a plurality of PWM pulses, the plurality of PWM pulses having a number of widths defined by first and second PWM edges, the PWM signal being generated by varying the widths of the PWM pulses, a first PWM edge of a PWM pulse being formed in response to a clock pulse, a second PWM edge of the PWM pulse being formed in response to a timing signal of the series of timing signals, the first PWM edge being a rising edge that is synchronized to a rising edge of the clock signal.

17. The method of claim 16 and further comprising generating a pulse-width modulated delayed signal with a plurality of pulses that are phase shifted from the pulse width modulated signal.

18. The method of claim 17 wherein the pulse-width modulated signal turns off an n-channel transistor before the pulse-width modulated delayed signal turns on a p-channel transistor connected to the n-channel transistor.

19. A pulse width modulator comprising:
a timing generator connected to receive a clock signal, and generate a series of timing signals in response to the clock signal, the timing signals representing a series of delayed clock signals, the clock signal having a plurality of clock pulses, each clock pulse having a first clock edge and a second clock edge; and
a phase selector connected to receive the timing signals from the timing generator, the clock signal, and a selection signal that identifies the timing signals, and generate a pulse-width modulated (PWM) signal that has a plurality of PWM pulses, each PWM pulse having a first PWM edge and a second PWM edge, the phase selector generating the first PWM edge of a PWM pulse in response to an edge of a clock pulse, and the second PWM edge of the PWM pulse in response to a timing signal identified by the selection signal.

20. The pulse width modulator of claim 19 wherein the first PWM edge is synchronized to the edge of the clock signal.

21. The pulse width modulator of claim 19 wherein the phase selector forms the PWM signal by varying widths of the PWM pulses, each PWM pulse having a width defined by a first PWM edge and a second PWM edge.

22. The pulse width modulator of claim 20 wherein the clock signal has a period, and the PWM signal has a period substantially equal to the period of the clock signal.

23. The pulse width modulator of claim 20 wherein the phase selector receives no other clock signal with a frequency that is greater than a frequency of the clock signal.

24. The pulse width modulator of claim 19 and further comprising a selection signal generator that outputs the selection signal in response to an input signal.

25. The pulse width modulator of claim 24 wherein the selection signal generator includes:
- a delay line having a sequence of elements that are connected to a supply voltage, the input signal passing through the delay line; and
- a number of latches that capture a logic state from each of a number of the elements to indicate how far the input signal traveled down the delay line during a sample period, the selection signal including an up signal and a down signal, the up/down signal up and down signals being generated from the plurality of logic states logic state of the number of the elements to increase or decrease the supply voltage so that the input signal travels a predetermined distance down the delay line during the sample period.

26. The pulse width modulator of claim 19 wherein the phase selector generates a pulse-width modulated delayed signal with a plurality of pulses that are phase shifted from the pulse width modulated signal.

27. The pulse width modulator of claim 26 wherein the pulse-width modulated signal turns off an n-channel transistor before the pulse-width modulated delayed signal turns on a p-channel transistor connected to the n-channel transistor.

28. The method of claim 16 wherein the timing signal that forms the second PWM edge of the PWM pulse is identified by a selection signal.

* * * * *

UNITED STATES PATENT AND TRADEMARK OFFICE
CERTIFICATE OF CORRECTION

PATENT NO. : 7,113,014 B1  Page 1 of 1
APPLICATION NO. : 10/402091
DATED : September 26, 2006
INVENTOR(S) : Doyle It is certified that error appears in the above-identified patent and that said Letters Patent is hereby corrected as shown below:

Title Page,

Item (56), References Cited, OTHER PUBLICATIONS, Col. 2, delete " Kaushik Roy, Leakage Tolerant Circuits, Sub-Threshold Logic [online]. No date, [Retrieved by inventor approximately Nov. 1, 2002]. Retrieved from, the Internet: URL:http://www.ece.purdue.edu/vis1/seven.pdf, pp. 1-43" and replace with --Kaushik Roy, Leakage Tolerant Circuits, Sub-Threshold Logic [online]. No date, [Retrieved by inventor approximately Nov. 1, 2002]. Retrieved from the Internet: URL:http//www.ece.purdue.edu/visi/seven.pdf, pp. 1-43--.

Item (56), References Cited, OTHER PUBLICATIONS, Col. 1, Page 2, delete "Robert W. Wrickson and Dragan Maksiomovic, Fundamentals of Power Electronics, Second Edition, Kluwer Academic Publishers, 2001, pp. 333", and replace with --Robert W. Wrickson and Dragan Maksimovic, Fundamentals of Power Electronics, Second Edition, Kluwer Academic Publishers, 2001, pp. 333--.

Column 11

Line 10, delete "up/down signal".

Line 11, delete "plurality of logic states".

Signed and Sealed this

Nineteenth Day of December, 2006

JON W. DUDAS
*Director of the United States Patent and Trademark Office*